(12) United States Patent
Meier et al.

(10) Patent No.: US 6,653,858 B2
(45) Date of Patent: Nov. 25, 2003

(54) BYPASS CAPACITANCE LOCALIZATION

(75) Inventors: Victoria Meier, Ft Collins, CO (US); Paul D Nuber, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/020,366

(22) Filed: Dec. 12, 2001

(65) Prior Publication Data

US 2003/0107396 A1 Jun. 12, 2003

(51) Int. Cl.[7] .................. H03K 19/173; H03K 17/16
(52) U.S. Cl. .................. 326/37; 326/101; 326/27; 257/532; 716/1
(58) Field of Search .................. 326/37–38, 41, 326/47, 101–102, 26–27; 257/532; 716/1, 8

(56) References Cited

U.S. PATENT DOCUMENTS

| | | | | |
|---|---|---|---|---|
| 6,054,751 A | * | 4/2000 | Ichikawa et al. | 257/532 |
| 6,118,169 A | * | 9/2000 | Nuber et al. | 257/532 |
| 6,236,232 B1 | * | 5/2001 | Barnes | 326/44 |
| 6,346,743 B1 | * | 2/2002 | Figueroa et al. | 257/723 |

* cited by examiner

*Primary Examiner*—Michael Tokar
*Assistant Examiner*—James H. Cho

(57) ABSTRACT

Localizing bypass capacitance for the purpose of reducing or eliminating noise in power supplies in an integrated circuit (IC). After a data path block of macro cells has been constructed by the IC designer, a determination is made as to which cells of the macro cells comprise functionality that will not be used by the IC when it is operating. At least a plurality of cells that are determined to be cells that comprise functionality that will not be used when the IC is operating are filled with bypass capacitors. Because there are typically a large number of cells that will not be used when the IC is operating, filling a plurality or all of these cells with bypass capacitors ensures that bypass capacitors will be located in close proximity to power supplies on the IC, which ensures that the bypass capacitors will be effective at reducing or eliminating noise in the power supplies.

14 Claims, 3 Drawing Sheets

__US 6,653,858 B2__

BYPASS CAPACITANCE LOCALIZATION

TECHNICAL FIELD OF THE INVENTION

The present invention is relates to integrated circuit (IC) design and fabrication and, more particularly, to localizing bypassed capacitance with respect to sources of noise within an integrated circuit in order to optimize the effectiveness of the bypass capacitance.

BACKGROUND OF THE INVENTION

In IC design, a design technique known as "data path" is used, in which a bus passes through one macro cell after another, with each macro cell performing particular operations on the bus signals. A macro cell generally is a rectangular, tiled arrangement of leaf cells which performs a function, such as 'register', 'and' or 'add' logical functions on the bus signals. The data path design technique reduces routing complexity of the buses because each bus line enters one side of a cell of the macro cell and exits the opposite side of the cell of the macro cell. For example, assuming the IC comprises two 64-bit buses, a macro cell may comprise 64 cells, each of which comprises an AND gate. Two lines from each of the 64-bit buses pass through each respective cell and the corresponding signals on the two lines are ANDed together. The lines of the buses then exit the opposite side of the cell with signals on them that depend on the operation(s) performed by the cell. Other examples of macro cells include a macro cell having 64 flip flops, 64 exclusive NOR gate (XNOR), etc.

When an IC is designed in this manner with macro cells, the design is normally tiled because the macro cells are designed with respect to the width of the bus, or buses, such that the bus lines enter the top of a cell and exit the bottom of a cell and continue on to, for example, the next macro cell. Therefore, the IC will typically comprise a large number of these macro cells arranged symmetrically. Generally, before the IC is ever designed, a library of data path macro cells is created so that the IC designer will have a full set of macro cells having various types of functionality to work with when designing the IC. The IC designer then builds the data path block, which generally is a stack of the macro cells with appropriate connections made to all of the macro cells and the cells of the macro cells.

It is known to use bypass capacitance in integrated circuits for the purpose of reducing noise in the power supply of the IC. In the past, bypass capacitors have been added at various locations within the IC to control noise in the power supplies. However, the manner in which bypass capacitors have been located within the IC in the past does not optimize the effectiveness of the bypass capacitors at reducing noise. One of the reasons that these techniques are not always effective is that the bypass capacitors are sometimes located a relatively long distance away from the power supplies, which reduces the effectiveness of the bypass capacitors.

Using bypass capacitance in an effective manner to reduce noise on an IC can eliminate unacceptable levels of noise, which can cause incorrect states to occur in the IC and thus prevent the IC from functioning properly. With the clock rates at which ICs are now capable of operating, incredibly high frequency components can be generated in the IC. These high frequency components can cause the power supplies of the IC to become noisy. By connecting a bypass capacitor between the power supply, VDD, and ground, GND, as shown in FIG. 1, the high frequency components can be filtered out of the power supply. The bypass capacitor maintains some extra charge local to the power supply that maintains the power supply at the correct voltage level, thereby preventing the power supply from unacceptably fluctuating between one voltage level and another.

FIG. 1 illustrates a circuit diagram of a simple inverter in parallel with a bypass capacitor 1. When the input signal 2 to the inverter is high, node 3 is high, and the Pfet P1 is turned off and the Nfet N1 is turned on, thereby pulling the output node 4 down to ground, GND 5. When the input signal 2 is low (node 3 is low), the Pfet P1 is turned on and the Nfet N1 is turned off, which causes the output to be pulled up to VDD 6.

Because the input signal 2 can change extremely rapidly in current ICs, the power supply VDD 6 can be "tugged on" at very high rates, which can cause noise to be coupled into the power supply VDD 6. The bypass capacitor 7 shown in parallel with the inverter and connected on one end to VDD 6 and the other end to ground GND 5 maintains a charge that helps the power supply VDD 6 to remain at a particular desired voltage level despite the speed at which input signal 2 changes. Therefore, the bypass capacitor 7 is effective at eliminating or reducing noise in the power supply VDD 6 and ground GND 5.

It should be noted that the bypass capacitor 7 is localized with respect to the power supply VDD 6, and therefore is effective. However, as stated above, prior and current techniques that are used to select the locations for the bypass capacitors do not always provide for such localization, and definitely do not ensure such localization. To the contrary, bypass capacitance locations are currently determined after the transistors, conductors, etc., have been laid out in a IC particular design. The locations for the bypass capacitors are selected as permitted by the design of the IC after the layout of many of the other components of the IC has been created. One of the disadvantages of this approach is that the bypass capacitors may end up being placed at locations where their ability to be effective is not optimized. As stated above, this generally is because the bypass capacitors are located too far away from the power supplies due to the lack of good locations from which to choose for the bypass capacitors. Another disadvantage of the current techniques for placing bypass capacitors in the IC is that current techniques do not optimize the use of spatial area on the IC.

Accordingly, a need exists for a technique that ensures localization of bypass capacitance so that noise in the power supply resulting from the aforementioned high frequency components can be minimized or eliminated.

SUMMARY OF THE INVENTION

The present invention provides for bypass capacitance localization in order to optimize the effectiveness of bypass capacitance at eliminating or reducing noise in the power supplies of an integrated circuit (IC). In accordance with the present invention, a determination is made as to which cells of macro cells of an IC have functionality that will actually be implemented during operations of the IC. Cells that have functionality that will not be used during the operations of the IC are identified as fill cells. At least a plurality of these fill cells are filled with bypass capacitors to ensure that there will be a sufficient amount of bypass capacitance in the IC to eliminate or reduce noise in the power supplies. Preferably most if not all of the identified fill cells are filled with bypass capacitors to ensure that the power supplies of the IC have bypass capacitors that are local to the power supplies of the IC. This ensures that noise in the power supplies will be eliminated or reduced by the effects of the bypass capacitors.

Because the fill cells exist on the IC, but are not a functional component of the IC, locating the bypass capacitors in these fill cells optimizes the use of space on the IC for bypass capacitors. Also, since there are typically many cells that will not be used once the data path block of macro cells has been constructed, by filling this large number of fill cells with bypass capacitors, it is virtually ensured that the power supplies of the IC will have bypass capacitors that are local to the power supplies, which ensures the effectiveness of the bypass capacitors without wasting real estate on the IC.

These and other features and advantages of the present invention will become apparent from the following description, drawings and claims.

DETAILED DESCRIPTION OF THE PREFERRED EMBODIMENT

Figure 1:
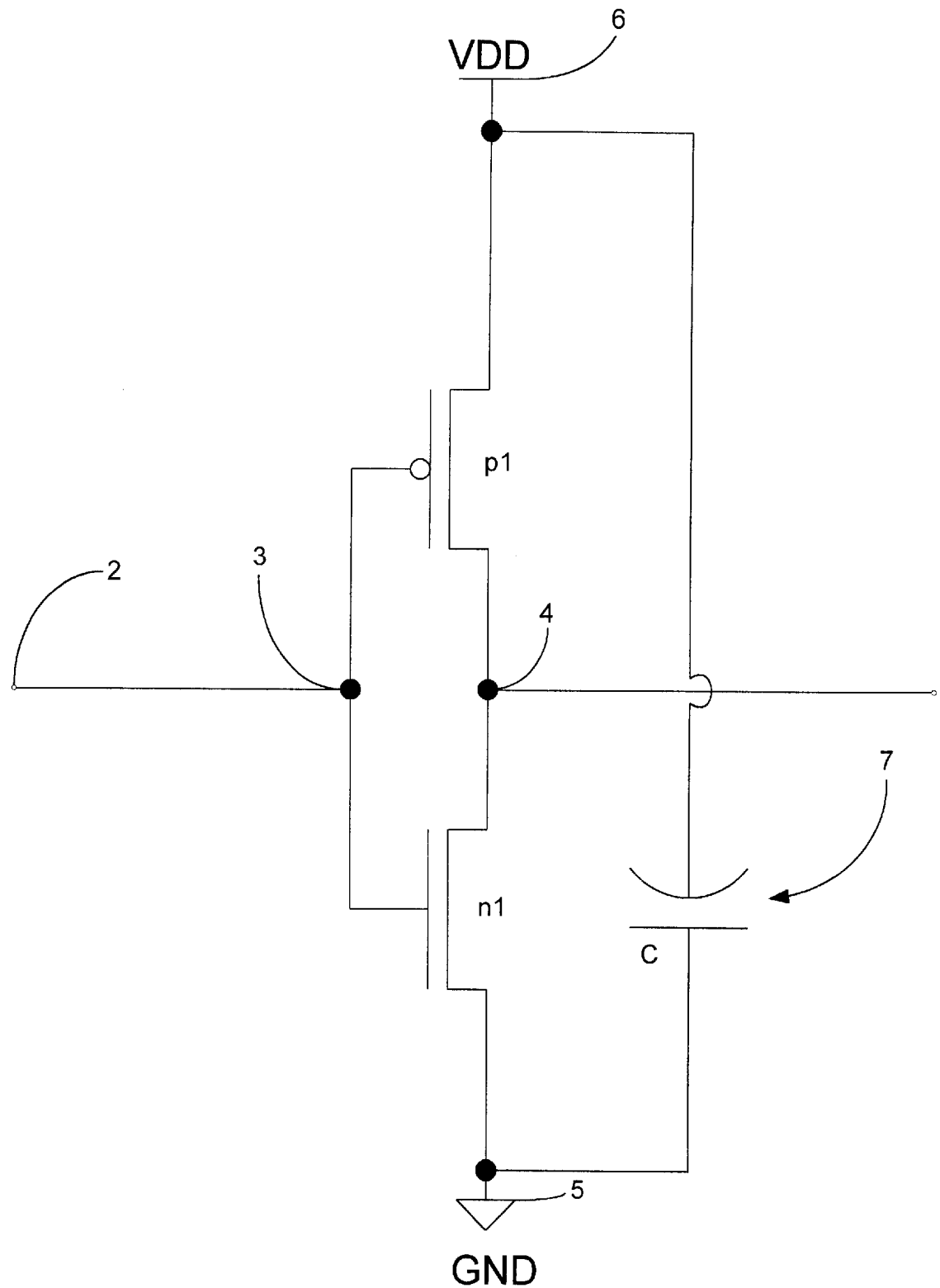
FIG. 1 is a schematic diagram illustrating an inverter in parallel with a bypass capacitor.
Figure 2:
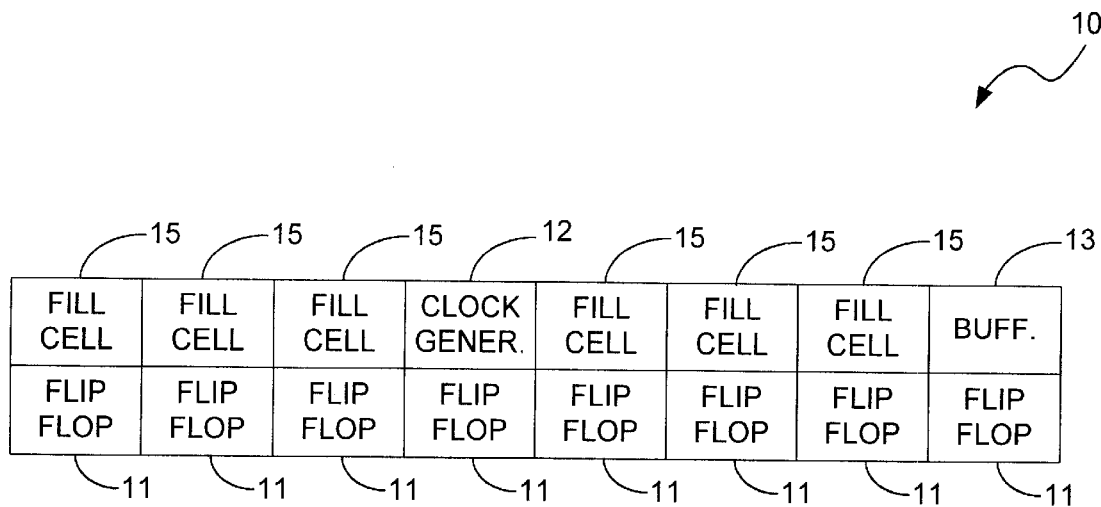
FIG. 2 illustrates a macro cell of an IC having unused cells.

Once the IC designer has created the data path block, the widths and heights of the macro cells and of each cell of the macro cells are known. Some of the cells have functionality that will not be implemented during operation of the IC. This can be seen by the example of the portion of the macro cell 10 shown in FIG. 2. In this example, the macro cell has only 16 ells. The cells 11 in the bottom row of the macro cell 10 each contain flip flop logic. The top row of the macro cell 10 includes a clock generation cell 12 that controls the timing of the logic of the macro cell 10, a buffer cell 13 and six empty cells 15, labeled as "fill cells".

Figure 3:
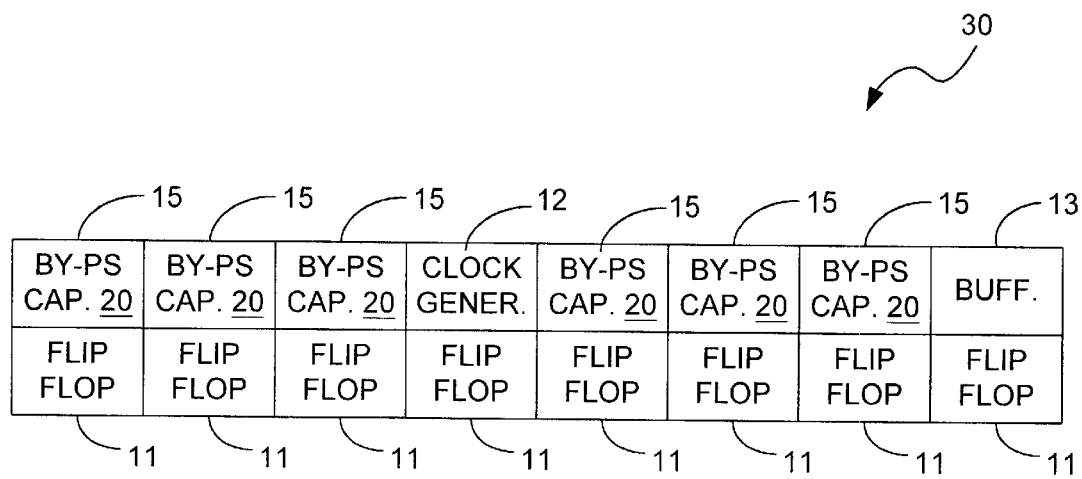
FIG. 3 illustrates the macro cell shown in FIG. 2 wherein the empty fill cells of the macro cell of FIG. 2 have been filled in with bypass capacitance in accordance with the present invention.

In accordance with the present invention, each of these fill cells 15 of the macro cell 30 is filled with bypass capacitance 20, as shown in FIG. 3. By filling each unused cell 15 of the macro cell 30 with bypass capacitance, localization of bypass capacitance with respect to power supplies and other sources of noise is ensured. In reality, after the IC designer has built the data path block, a vast number of unused cells remain. By filing these unused cells with bypass capacitance 20, the amount of bypass capacitance contained in the IC can be maximized without the need for determining where bypass capacitors should be located. Also, by placing the bypass capacitance 20 in the unused fill cells 15, it is virtually guaranteed that the bypass capacitance will be localized due to the large number of unused fill cells 15. Therefore, the use of spatial area on the IC for bypass capacitance is optimized and, at the same time, the effectiveness of the bypass capacitance in the IC is maximized.

Figure 4:
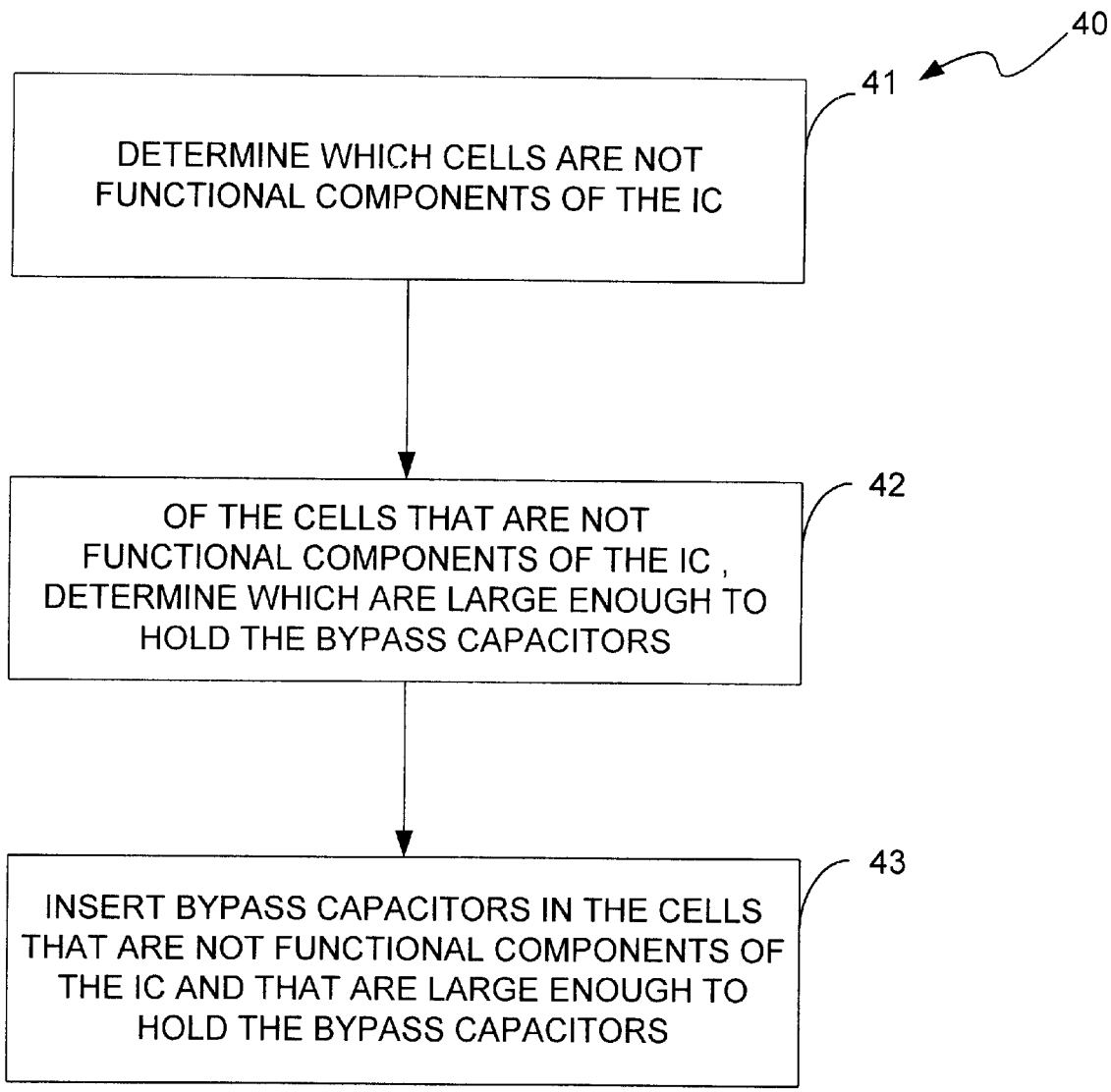
FIG. 4 is a flow chart demonstrating an example embodiment of the method by which bypass capacitors are placed in an IC in accordance with the present invention.

FIG. 4 is a flow chart illustrating an example embodiment of the method 40 of the present invention for ensuring that bypass capacitance is localized and effective. As stated above, the IC designer builds the data path block, which connects all of the cells having functionality that will be implemented. After the data path block has been constructed, a determination is made as to which cells of the macro cells have functionality that is not part of the data path block, i.e., functionality that will not be used. This step is represented by block 41. Of the cells that will not be used, a determination is made as to which cells a large enough to accommodate bypass capacitors, as indicated by block 42. The cells that are large enough to accommodate bypass capacitors then have bypass capacitors inserted into them, as indicated by block 43.

It should be noted that the step represented by block 42 is not necessary, but is merely preferably. For example, macro cells could be added merely for the purposes of holding bypass capacitors. However, this might defeat some of the goals of the present invention, such as optimizing the use of real estate on the IC.

It should be emphasized that the above-described embodiments of the present invention are example embodiments set forth for the purpose of providing a clear understanding of the principles of the invention and the manner in which the present invention can be implemented. Many variations and modifications may be made to the above-described embodiments that are within the scope of the present the invention, as will be understood by those skilled in the art in view of this disclosure. All such modifications and variations are intended to be within the scope of the present invention.

What is claimed is:

1. An integrated circuit (IC) having a plurality of macro cells, each macro cell having a plurality of cells comprising functionality, the IC comprising:

at least one macro cell having at least one fill cell, the fill cell comprising functionality that will not be used when the IC is operating; and a bypass capacitor located in each said at least one fill cell.

2. The IC of claim 1, wherein the IC comprises a plurality of macro cells that have cells comprising functionality that will not be used when the IC is operating, each of the cells comprising functionality that will not be used when the IC is operating constituting a fill cell, each fill cell having a bypass capacitor located therein.

3. The IC of claim 2, wherein a plurality of the cells having bypass capacitors located therein are in close proximity to power supplies, VDD, and ground, GND, of the IC and operate to reduce or eliminate noise in the power supplies.

4. The IC of claim 2, wherein said bypass capacitors are placed in said fill cells after a data block has been constructed from said plurality of macro cells.

5. The IC of claim 1, wherein said bypass capacitor located in each of said at least one fill cell is in close proximity to power supplies, VDD, and ground, GND, of the IC and operates to reduce or eliminate noise in the power supplies.

6. The IC of claim 1, wherein the IC is designed using field effect transistor (FET) technology.

7. The IC of claim 1, wherein the IC is designed using bipolar junction transistor (BJT) technology.

8. A method for localizing bypass capacitance in an integrated circuit (IC), the IC comprising a plurality of macro cells that have cells comprising functionality that will not be used when the IC is operating, each of the cells comprising functionality that will not be used constituting a fill cell, the method comprising the steps of:

determining whether a cell is a fill cell; and locating a bypass capacitor in any cell determined to be a fill cell.

9. The method of claim 8, wherein at least one bypass capacitor is located in a fill cell that is in close proximity to power supplies, VDD, and ground, GND, of the IC and operates to reduce or eliminate noise in the power supplies.

10. The method of claim 9, wherein a plurality of the cells have bypass capacitors located therein, and wherein a plurality of the cells having bypass capacitors located therein are in close proximity to power supplies, VDD, and ground, GND, of the IC and operate to reduce or eliminate noise in the power supplies.

11. The method of claim 10, wherein said bypass capacitors are located in said fill cells after a data block has been constructed from said plurality of macro cells.

12. The method of claim 11, wherein the step of determining whether a cell is a fill cell is performed by a computer executing a computer program, the computer program determining which cells are fill cells after the data block has been constructed.

13. The method of claim 8, wherein the IC is designed using field effect transistor (FET) technology.

14. The method of claim 8, wherein the IC is designed using bipolar junction transistor (BJT) technology.

* * * * *